(12) United States Patent
Hueting et al.

(10) Patent No.: US 7,235,842 B2
(45) Date of Patent: Jun. 26, 2007

(54) INSULATED GATE POWER SEMICONDUCTOR DEVICES

(75) Inventors: Raymond J. E. Hueting, Helmond (NL); Erwin A. Hijzen, Blanden (BE); Michael A. A. In't Zandt, Veldhoven (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 10/564,214

(22) PCT Filed: Jul. 12, 2003

(86) PCT No.: PCT/IB04/02248

§ 371 (c)(1),
(2), (4) Date: Jan. 9, 2006

(87) PCT Pub. No.: WO2005/006446

PCT Pub. Date: Jan. 20, 2005

(65) Prior Publication Data

US 2006/0189063 A1    Aug. 24, 2006

(30) Foreign Application Priority Data

Jul. 12, 2003   (GB) ................................. 0316362.3

(51) Int. Cl.
  *H01L 29/76*   (2006.01)
  *H01L 21/336*  (2006.01)
(52) U.S. Cl. ............... 257/330; 257/331; 257/E29.201; 438/268; 438/270
(58) Field of Classification Search ........ 257/330–334, 257/E29.201, E21.418; 438/268, 270
  See application file for complete search history.

(56) References Cited

U.S. PATENT DOCUMENTS 4,992,390 A   2/1991 Chang
6,262,453 B1 * 7/2001 Hshieh ..................... 257/341
6,359,308 B1 * 3/2002 Hijzen et al. ............. 257/341
6,518,127 B2 * 2/2003 Hshieh et al. ............ 438/270
6,809,375 B2 * 10/2004 Takemori et al. ......... 257/329
6,833,583 B2 * 12/2004 In't Zandt et al. ........ 257/330
2006/0289929 A1 * 12/2006 Andrews .................. 257/330

FOREIGN PATENT DOCUMENTS

WO   WO 02/15254   2/2002
WO   WO 02/19432   3/2002
WO   WO 03/043089  5/2003

* cited by examiner

Primary Examiner—T. N. Quach

(57) ABSTRACT

A trench-gate semiconductor device (100) has a trench network (STR1, ITR1) surrounding a plurality of closed transistor cells (TCS). The trench network comprises segment trench regions (STR1) adjacent sides of the transistor cells (TCS) and intersection trench regions (ITR1) adjacent corners of the transistor cells. As shown in FIG. 16 which is a section view along the line II-II of FIG. 11, the intersection trench regions (ITR1) each include insulating material (21D) which extends from the bottom of the intersection trench region with a thickness which is greater than the thickness of the insulating material (21B1) at the bottom of the segment trench regions (STR1). The greater thickness of the insulating material (21D) extending from the bottom of the intersection trench regions (ITR1) is effective to increase the drain-source reverse breakdown voltage of the device (100). The insulating material (21D) which extends from the bottom of each intersection trench region (ITR1) may extend upwards to thicken the insulating material at the corners of the cells (TCS) over at least part of the vertical extent of the channel-accommodating body region (23) so as to increase the threshold voltage of the device.

13 Claims, 15 Drawing Sheets

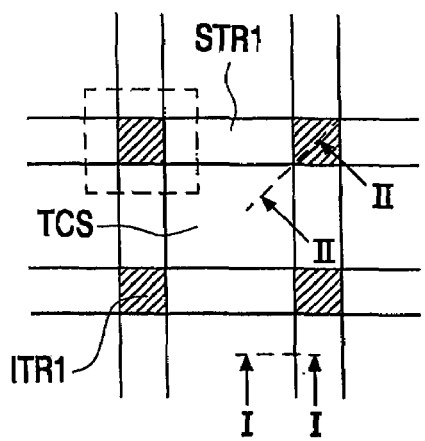
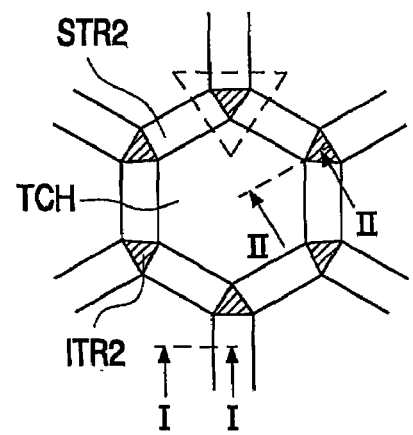
Fig.6A  Fig.7A
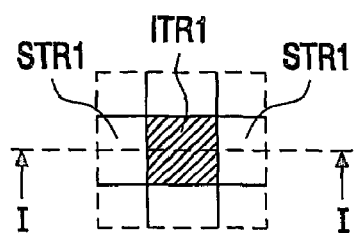
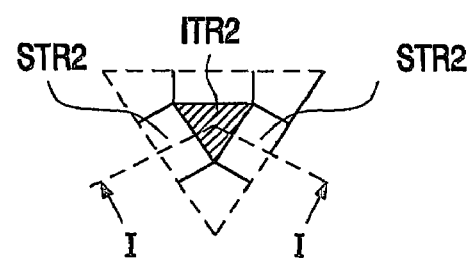
Fig.6B  Fig.7B
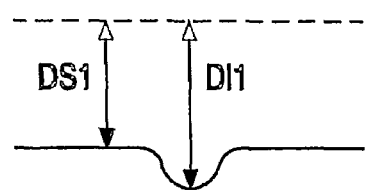
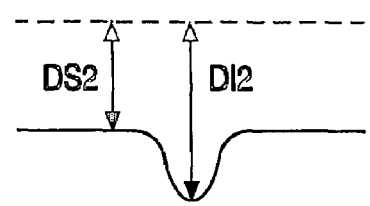
Fig.6C  Fig.7C

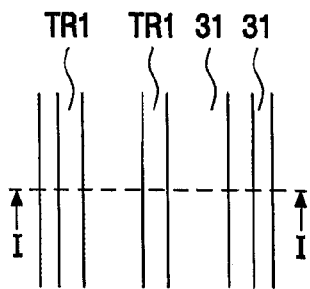 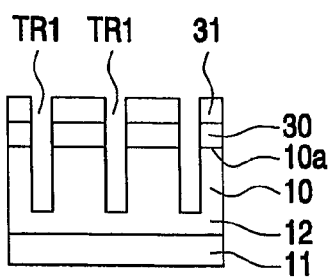
Fig.20A        Fig.20B
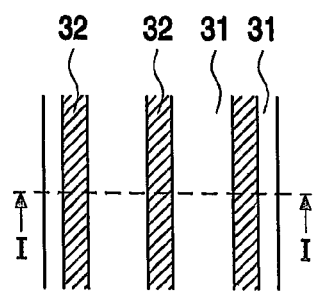 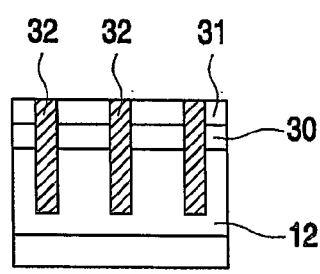
Fig.21A        Fig.21B
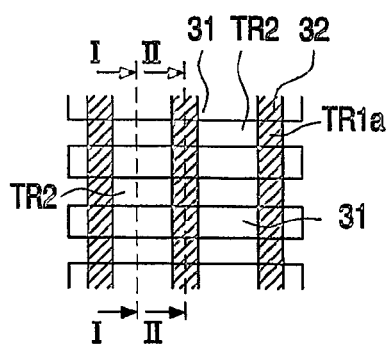 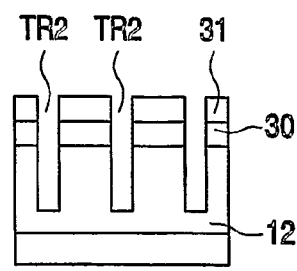 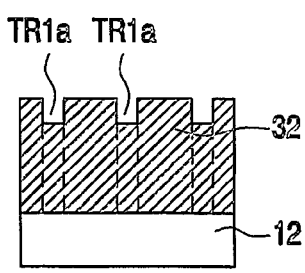
Fig.22A        Fig.22B        Fig.22C

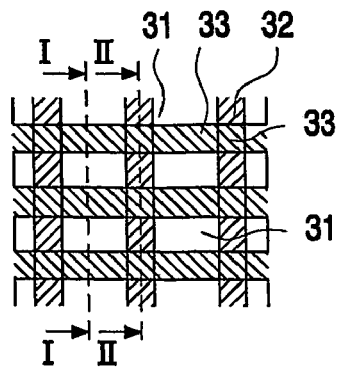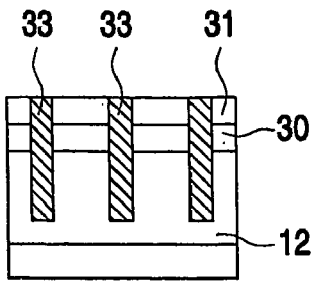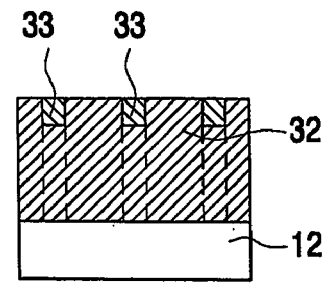
Fig.23A　　　Fig.23B　　　Fig.23C
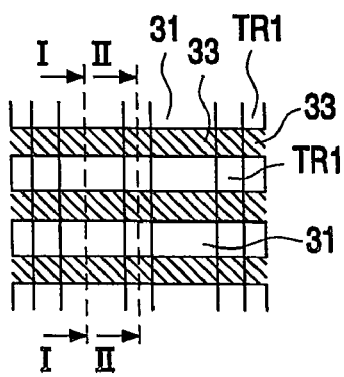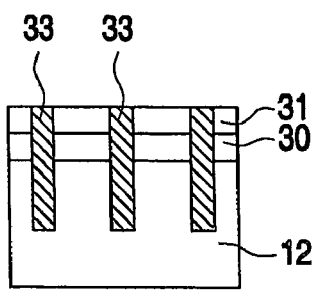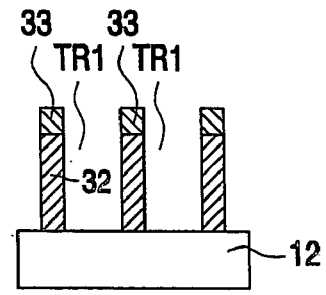
Fig.24A　　　Fig.24B　　　Fig.24C
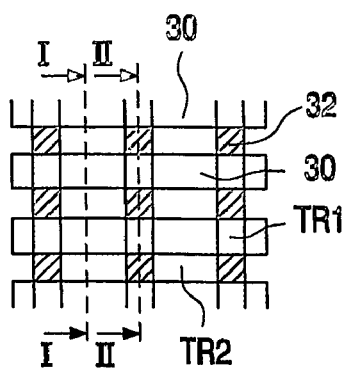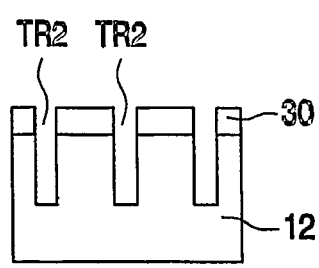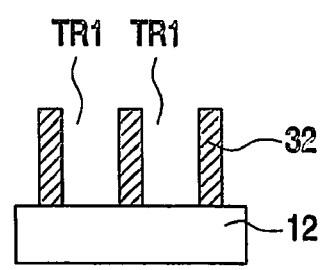
Fig.25A　　　Fig.25B　　　Fig.25C

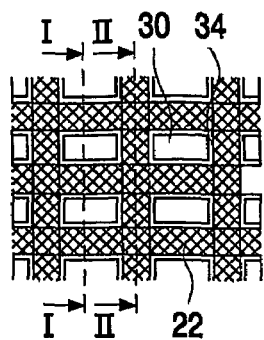
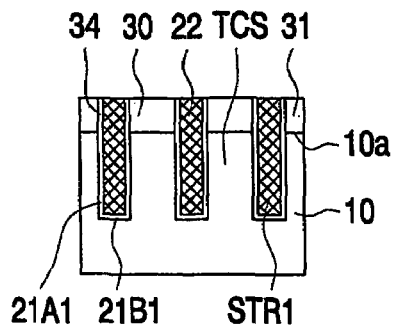
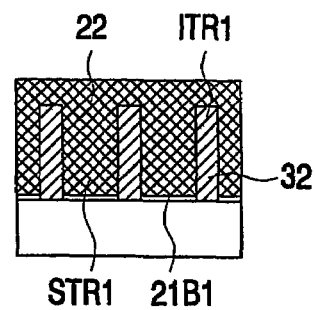
Fig.26A     Fig.26B     Fig.26C
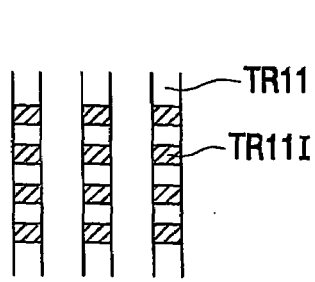
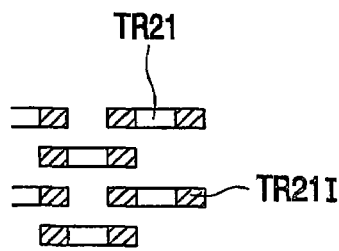
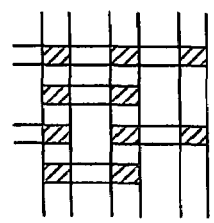
Fig.27A     Fig.27B     Fig.27C
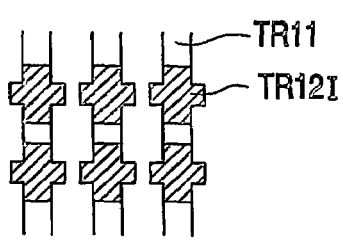
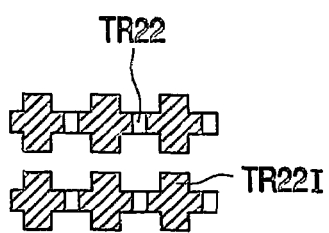
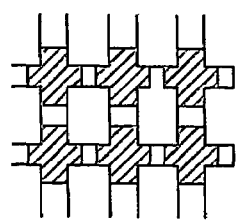
Fig.28A     Fig.28B     Fig.28C

INSULATED GATE POWER SEMICONDUCTOR DEVICES

BACKGROUND OF THE INVENTION

1. Field of the Invention

The present invention relates to insulated gate power transistor semiconductor devices, and to methods of making such devices.

2. Description of Related Art

Vertical insulated gate field effect power transistor semiconductor devices are known comprising a semiconductor body having an active area with a plurality of electrically parallel transistor cells, wherein each transistor cell has a source region and a drain region which are separated by a channel-accommodating body region adjacent a peripheral insulated gate structure.

Two types of such known vertical insulated gate power transistor devices are the double-diffused metal-oxide-semiconductor form of vertical MOSFET device (VDMOS), and the trench-gate form of vertical MOSFET device. In a VDMOS device the gate structure has a planar gate insulation layer on the top surface of the semiconductor body with the gate material thereon. In the on-state of this device current flows in each transistor cell from the source region laterally under the gate insulation layer in a conduction channel through the body regions into a peripheral drain drift region and then vertically through the drain drift region. In a trench-gate device the gate structure has a trench which extends vertically through the body region with a gate insulation layer at the vertical and bottom walls of the trench and gate material in the trench within the gate insulation. In the on-state of this device current flows in each transistor cell only vertically from the source region in a conduction channel next to the vertical gate insulation layer through the body region into a drain drift region.

A desirable property of power transistors is to have a low on-state resistance. Considering the two known power transistor devices just described, it is known that when both these device structures are used for low and medium voltage power transistors, that it is with a drain-source breakdown reverse voltage of up to respectively about 50 volts and about 200 volts, the on-state resistance of the device is to a large extent dependent on the sum total of the conducting channel peripheries. Thus for a given size of the device, that is a given active transistor cell area, a larger number of transistor cells in that active area leads to a lower on-state resistance. A limitation in this respect for the VDMOS device is that if the transistor cells are packed too close together by reducing the lateral extent of the peripheral drain drift region then the "Junction-FET" effect in this region will constrict the vertical current flow path down to the drain. The trench-gate device does not have this "Junction-FET" limitation, so that for a given size of device the trench-gate structure can have more transistor cells and a lower on-state resistance.

Another desirable property for power transistors is to have good switching performance, that is fast switching and low switching losses when the device is turned on and turned off. This is particularly important where the power transistor is to be used in the output stage of a power supply, for example a voltage regulation module (VRM), where it is continuously turned on and off at very high frequency. This good switching performance depends particularly on the device having a low gate-drain capacitance. A limitation in this respect for the trench-gate device is the contribution to gate-drain capacitance added by the gate insulation at the bottom of the trench. The VDMOS device does not have this added contribution to gate-drain capacitance.

Although both on-sate resistance and gate-drain capacitance are important as discussed above, the present invention is more particularly concerned with devices having the possibility of very low on-state resistance and so relates exclusively to trench-gate devices.

FIG. 1 of the accompanying drawings shows a schematic cross-section view of a known trench-gate form of vertical MOSFET power transistor semiconductor device 1. The device 1 comprises a silicon semiconductor body 10 with top and bottom major surfaces 10a, 10b, first conductivity type drain region 11 and a first conductivity type drain drift region 12.

FIG. 1 shows the lateral extent (the cell pitch) of one complete transistor cell TC and part of an adjacent transistor cell at either side of the cell TC. Two sections are shown of a peripheral insulated gate structure G located in a trench 20 at the boundary between each two adjacent transistor cells. The trench-gate structure G extends vertically through a channel-accommodating second, opposite, conductivity, type body region 23 into the drain drift region 12, and has silicon dioxide insulating material 21 at the vertical and bottom walls of the trench 20 and gate material 22 in the trench 20 within the insulating material 21. A source region 24, of the first conductivity type, is present in each transistor cell under the top major surface 10a and adjacent the trench gate 21, 22. Thus the source region 24 and the drain drift region 12 are vertically separated by the channel-accommodating body region 23 adjacent the trench-gate 21, 22 provided by the peripheral insulated gate structure G. This enables a vertical conduction channel 23a to be formed in the body portion 23 when a suitable gate potential is applied to the gate material 22 in the on-state of the device 1, whereby current flows in a path in each transistor cell from the source region 24 vertically through the conduction channel 23a to the drain drift region 12.

An insulating region 25 is provided over the gate structure G. Source metallisation 18 contacting all of the source regions 24 is provided on the first major surface 10a over the insulating region 25 to provide a source electrode S. Although not shown, electrical connection to the insulated gate structure G is provided by extending the insulating material 21 from the trenches 20 on to the top surface 10a of the semiconductor body 10 in an inactive area outside the active transistor cell area and extending the gate material 22 on to this top surface insulating layer where it is contacted by metallisation to provide a gate electrode. A metallisation layer 19 forms an ohmic contact with the drain region 11 so as to provide a drain electrode D.

The cross-section view shown in FIG. 1 applies equally to each of two cell geometries which are known for trench-gate devices. FIG. 2 of the accompanying drawings shows a plan view of an open-cell geometry having a one-dimensionally repetitive pattern in which the trench-gates G1 are parallel stripes which each extend across the active area of the device at the peripheries of open stripe-shaped transistor cells TC1. In this case FIG. 1 shows a cross-section view along the line II-II of FIG. 2. FIG. 3 of the accompanying drawings shows a plan view of a closed-cell geometry having a two-dimensionally repetitive pattern in which a network of trench-gates G2 over the active area of the device surrounds closed polygonal transistor cells TC2. In this case FIG. 1 shows a cross-section view along the line III-III of FIG. 3 in which the closed cells are square shaped. Another commonly used closed polygonal transistor cell is hexagonal shaped, a cross-section view of which would again be as shown in FIG. 1. FIGS. 2 and 3 show the active cell area dimensions of the transistor cells for both the open-cell and closed-cell geometries which are the trench width T, the semiconductor mesa width M between trenches and the cell pitch P which is the sum of T and M.

FIG. 4 of the accompanying drawings shows measurements which we have made comparing the specific on-state resistance Rds,on (mOhm.mm$^2$) of an open stripe cell trench-gate device (curve 4A) and a closed square cell trench-gate device (curve 4B) as described with reference to FIGS. 1 and 3 over a range of cell pitches from 2 micron to 7 micron. In both cases the trench width is 0.4 micron at 2 micron cell pitch and about 0.6 micron for pitches greater than 2 micron, and the semiconductor material is {100} crystal orientation silicon. In these devices the channel-accommodating body region 23 extends vertically to approximately 0.7 micron below the upper surface 10a of the semiconductor body, the drain drift region 12 extends vertically to approximately 0.6 micron below the body region 23 and the trenches 20 are approximately 1.1 micron deep. The combination of the trench depth and the drain drift region depth are chosen to give a specified drain-source reverse breakdown voltage BVds for the device, in this case approximately 20 volts. The combination of the body region depth and the drain drift depth are chosen to give a low specific on-state resistance for the specified drain-source breakdown voltage of the device. It is to be noted that the body region and drain drift region vertical profiles are shallower, and the corresponding values for Rds,on shown in FIG. 4 are lower, than for currently commercially available devices.

FIG. 4 shows that, for the same cell pitch, the closed square cell devices have a lower specific on-state resistance than the open stripe cell devices. This is true down to about 2 micron cell pitch where the specific resistance is approximately equal for the two types of device. However, a further advantage of closed-cell devices compared with open-cell devices is that, particularly for low voltage devices, for a given cell pitch the specific on-state resistance for a closed cell device may be reduced by reducing the trench width whereas this is not possible for an open cell device. The reason for this is that for a closed cell device having a given cell pitch, reducing the trench width increases the channel perimeter and hence reduces the channel resistance; whereas for an open cell device reducing the trench width does not increase the channel perimeter. This possibility for reducing the specific resistance of closed cell devices is disclosed in International Patent Application published as WO-A-02/15254 (our reference PHNL010059), the contents of which are incorporated herein by reference, which also discloses a suitable method for producing narrow trenches in the range 0.4 micron to 0.1 micron; this method including forming a silicon nitride cup on the semiconductor body top surface, forming curved spacers of silicon dioxide within the nitride cup which are used to etch a window in the nitride cup and then etching a trench using the window in the nitride.

FIG. 5 of the accompanying drawings shows measurements which we have made comparing the drain-source reverse breakdown voltage BVds of an open stripe cell trench-gate device (curve 5A) with the BVds of a closed square cell trench-gate device (curve 5B) and a closed hexagonal cell trench-gate device (curve 5C) over a range of cell pitches from 2 micron to 7 micron. In all three devices the combination of the trench depth and the drain drift region depth dimensions is chosen to be the same as described above for the devices as measured in FIG. 4 to give a specified breakdown voltage BVds of 20 volts. Curve 5A shows that for the open stripe cell devices BVds has the specified value of 20 volts over the range of cell pitches, curve 5B shows that for the closed square cell devices BVds is reduced to about 17 volts over the range of cell pitches, and curve 5C shows that for the closed hexagonal cell devices BVds is further reduced to about 15 volts over most of the range of cell pitches. Considering the results shown in FIGS. 4 and 5, the breakdown voltage BVds could be increased for the closed cell devices by increasing the drain drift depth but this would also undesirably increase the specific resistance.

It is therefore desirable to increase the drain-source reverse breakdown voltage for closed cell trench-gate vertical power transistor semiconductor devices without increasing the specific on-state resistance as would occur in the manner mentioned just above. The invention seeks to address this issue using the inventors' appreciation of the properties of the corners of the transistor cells adjacent the intersection regions of the trench network for such closed cell devices, as will be discussed below.

FIGS. 6A and 7A of the accompanying drawings respectively show a plan view of part of a trench network of the closed square transistor cell device and of the closed hexagonal transistor cell device for which breakdown voltage BVds measurements have been shown in FIG. 5. As shown in FIG. 6A the trench network comprises a segment trench region STR1 adjacent each one of four sides of a transistor cell TCS and an intersection trench region ITR1 (shown shaded) adjacent each one of the four corners of the transistor cell TCS. As shown in FIG. 7A the trench network comprises a segment trench region STR2 adjacent each one of six sides of a transistor cell TCH and an intersection trench region ITR2 (shown shaded) adjacent each one of the six corners of the transistor cell TCH. The dotted square in FIG. 6A encloses the area around one of the intersection trench regions ITR1, this area is shown enlarged in FIG. 6B and a section view along the line I-I of FIG. 6B is shown in FIG. 6C. Likewise, the dotted triangle in FIG. 7A encloses the area around one of the intersection trench regions ITR2, this area is shown enlarged in FIG. 7B and a section view along the line I-I of FIG. 7B is shown in FIG. 7C. FIGS. 6C and 7C respectively show that the depth DI1, DI2 of the trench in the intersection regions is greater than the depth DS1, DS2 of the trench in the segment regions. An explanation for the trench depth effect as shown in FIGS. 6C and 7C is as follows. The trench networks shown in FIGS. 6A and 7A are each produced using a conventional process in which a mask pattern is provided for the whole trench network and there is one etching process for the whole network. In this case there is a loading effect which provides a more efficient supply and hence a greater concentration of the etch chemicals, with a resulting greater trench depth, at the intersection trench regions compared with the segment trench regions.

It will be noted that the intersection trench depth DI2 for the hexagonal closed cell device is shown in FIG. 7C to be greater than the intersection trench depth DI1 for the square closed cell device as shown in FIG. 6C. This will be the case if our following theory for the loading effect at the intersection trench regions is correct. This theory is that the loading effect is proportional to the number of segment trench regions at the periphery of an intersection trench region, four as shown in FIG. 6B and three as shown in FIG. 7B; and that the loading effect is inversely proportional to the area of an intersection trench region, $T^2$ for the square region ITR1 shown in FIG. 6B where T is the trench width and $0.43T^2$ for the equilateral triangle region ITR2 shown in FIG. 7B where the trench width T is the same. We have made experimental observations using SEM photography which confirm qualitatively that the intersection trenches are deeper than the segment trenches for both the square cell network and the hexagonal cell network. However, the limitations of SEM photography have prevented us from measuring the areas of the intersection trench regions for both these networks and from quantitatively measuring the depths of the intersection trenches for both these networks, and so we have been unable to confirm whether our loading effect theory described above is correct.

FIG. 8A of the accompanying drawings shows a cross-section view along the line I-I of both FIGS. 6A and 7A, that is showing part of the closed transistor cell TCS/TCH and part of the segment trench region STR1/STR2 adjacent a side of the cell for both the square closed cell device and the hexagonal closed cell device. FIG. 8B of the accompanying drawings shows a cross-section view along the line II-II of both FIGS. 6A and 7A, that is showing part of the closed transistor cell TCS/TCH and part of the intersection trench region ITR1/ITR2 adjacent a corner of the cell. FIGS. 8A and 8B show the greater depth of the intersection trench regions ITR1/ITR2 compared with the depth of the segment trench regions STR1/STR2 as has been described above with regard to FIGS. 6B, 6C, 7B and 7C. The dashed lines in FIGS. 8A and 8B show the concentration of equi-potential lines, for the same applied voltages, respectively at the bottom corner BC1 of the segment trench region STR1/STR2 at a side of the cell TCS/TCH and at the bottom corner BC2 of the intersection trench region ITR1/ITR2 at the corner of the cell TCS/TCH. These equi-potential lines become closer at both bottom corners BC1 and BC2, but are closer at the bottom corner BC2 than at the bottom corner BC1 which implies a higher electric field at the corner BC2 than at the corner BC1. An open cell geometry device such as shown in FIG. 2 has trench bottom corners such as BC1 but does not have trench bottom corners such as BC2. The higher electric field at the cell corner bottom trench corner BC2 is a major factor contributing to the lower drain-source breakdown voltage BVds shown in FIG. 5 for the closed cell devices compared with the open cell device. Also, the greater depth of intersection trench regions ITR2 compared with the intersection trench regions ITR1 if it be the case, and the hexagonal cell having six corners compared with the square cell having four corners, are consistent with the breakdown voltage BVds being lower for the hexagonal cell device (curve 5C) than for the square cell device (curve 5B) as shown in FIG. 5.

Another factor, apart from the greater intersection trench depths, which contributes to lower drain-source reverse breakdown voltage BVds in closed cell geometry devices compared with open cell devices is that in operation, because the charge in the surrounding trench gate must be equal and opposite to the charge in the drain drift region for each transistor cell, there is a concentration of electric charge in the drain drift region at the corners of the closed cells compared with at the sides of the closed cells. This charge concentration leads to a higher electric field at the corners of the closed cells which is effective at the bottom corners of the intersection trench regions to lower the breakdown voltage BVds.

In FIGS. 8A and 8B the insulating material 21A2 at the vertical sides of the corners of the intersection trench regions ITR1/ITR2 is shown to have the same thickness as the insulating material 21A1 at the vertical sides of the segment trench regions STR1/STR2; the thickness of the insulating material 21B2 at the bottom of the intersection trench regions ITR1/ITR2 is shown to have the same thickness as the insulting material 21B1 at the bottom of the segment trench regions STR1/STR2; and the vertical side thicknesses 21A1/21A2 are the same as the bottom thicknesses 21B1/21B2. These equal insulating material thicknesses are according to conventional practice.

FIG. 8C of the accompanying drawings exemplifies and illustrates an embodiment of the present invention, having insulating material 21C at the bottom of the intersection trench regions ITR1/ITR2 with a thickness greater than that of the insulating material 21B1 at the bottom of the segment trench regions STR1/STR2. As shown in FIG. 8C, the spacing of the equi-potential lines near the bottom trench corner BC2 at the corner of the closed cell is increased as a result of the increased bottom insulation material thickness, thereby reducing the maximum electric field at this corner BC2 and thereby increasing the drain-source reverse breakdown voltage BVds of the device.

Some simulation results on a trench-gate MOSFET device are given below. We were not able to do real three-dimensional simulations, but only some two-dimensional (2D) simulations. These 2D simulations are valid for stripe open cell structures and also for ideal (no variation in trench depth at intersections) hexagon closed cell structures. However these simulations could only be qualitatively be interpreted for square cells in off-state (i.e. breakdown voltage) by examining several cross-sections in each location in the cell and examining the equi-potential lines at breakdown condition.

In the simulations we used the same vertical doping profiles as for the devices from which we obtained our experimental data as described with reference to FIGS. 4 and 5. Further, we assumed a pitch of 2.0 microns and a trench width of 0.4 μm. Also, we assumed a trench depth of 1.2 microns and basically imagined as if that is the actual depth of an intersection trench. The actual segment trench depth in the other part of the active area is 1.05 microns, measured by using SEM analysis. Also a gate-oxide thickness of 31 nm was used.

Some simulation results are shown in FIG. 9A of the accompanying drawings. This Figure shows the equi-potential lines in the device for a drain-source voltage of 17V. The breakdown voltage was here also 17V. We conveniently took half the pitch size since reflective boundary conditions (mirror) at the left and right edges are used in this device simulator. For the exactly the same device structure we increased the oxide thickness in the bottom of the device towards 0.35 micron, as shown in FIG. 9B of the accompanying drawings. The equi-potential lines are again taken for 17V drain-source voltage. The simulations predict that the breakdown voltage of this structure is 23V, which is higher than that of the structure shown in FIG. 9A. Consequently, when we have a locally deeper trench in the intersection areas than in the segment areas as shown in FIG. 9A, the breakdown voltage reduces from about 20V towards 17V. However, when we use a thick oxide in the bottom of the trench as shown in FIG. 9B the breakdown of the total device results in 20V again, because the breakdown voltage of the structure shown in FIG. 9B is 23V and is higher than that of the segment trench region. We did the same simulations for hexagonal structures and obtained the same results for breakdown voltages as discussed above. It will be noted that the simulation results patterns of equi-potential lines distribution shown in FIGS. 9A and 9B correspond well with the equi-potential line patterns shown respectively in FIGS. 8B and 8C.

BRIEF SUMMARY OF THE INVENTIONS

Thus there is provided, in accordance with the present invention and as defined in claim 1, a vertical power transistor trench-gate semiconductor device having a trench network extending into a semiconductor body and surrounding a plurality of closed transistor cells, wherein the trench network comprises segment trench regions adjacent sides of the transistor cells and intersection trench regions adjacent corners of the transistor cells, wherein each transistor cell has a source region and a drain region which are vertically separated by a channel-accommodating body region adjacent a segment trench region at each side of the transistor cell, and wherein each segment trench region contains gate material separated from the semiconductor body by insulating material at the vertical sides and at the bottom of the segment trench region, wherein the intersection trench regions each include insulating material which extends from the bottom of the intersection trench region with a thickness which is greater than the thickness of the insulating material at the bottom of the segment trench regions, gate material being provided above the insulating material in the intersection trench regions and bridging the gate material in the segment trench regions, wherein the greater thickness of the insulating material extending from the bottom of the intersection trench regions is effective to increase the drain-source reverse breakdown voltage of the device.

As mentioned above, in addition to the requirement for a power transistor to have a low on-state resistance, it is also desirable for a power transistor to have a low gate-drain capacitance Cgd for good switching performance and a limitation in this respect for a trench-gate device is the contribution to gate-drain capacitance added by the gate insulation at the bottom of the trenches. The contribution to the device gate-drain capacitance by the insulation at the bottom of the intersection trench regions is reduced by the greater thickness of the insulation in these regions in accordance with the invention as specified above. The possibility of reducing the device gate-drain capacitance by increasing the thickness of the trench bottom insulation throughout the trench network of a closed cell trench-gate device is already known, for example from U.S. Pat. No. 4,992,390 and from WO-A-2003/043089 (our reference PHNL020937). An advantageous optional feature of the present invention is therefore to have a combination wherein the insulating material is thicker at the bottom of the trench segment regions than at the vertical sides of the trench segment regions so as to reduce the gate-drain capacitance of the device, and wherein the greater thickness of insulating material extending from the bottom of the intersection trench regions further reduces the gate-drain capacitance of the device.

In a device according to the present invention, with or without the optional combination concerning gate-drain capacitance, the closed transistor cells may each be rectangular (square or oblong) shaped with a said segment trench region adjacent each one of four sides of the cell. In this case each intersection trench region may have a square shaped area, or each intersection trench region may have a cruciform shaped area. Another possibility is that the closed transistor cells may each be hexagonal shaped with a said segment trench region adjacent each one of six sides of the cell.

The effect on the drain-source reverse breakdown voltage of the properties of the corners of the transistor cells adjacent the intersection regions of the trench network of closed cell devices has been discussed above, and it has been mentioned that, in operation, there is a concentration of electric charge, and hence a higher electric field, at the corners of the closed cells compared with at the sides of the closed cells. This higher electric field at the corners of the closed cells also has the effect of decreasing the threshold voltage Vth of the device, that is the gate-source voltage at which an electron channel has formed through the body region and the device is in the on state with current flow between the drain and source regions, as will now be explained with reference to FIGS. 10A and 10B of the accompanying drawings.

FIG. 10A shows a horizontal cross-section view of part of a known closed square transistor cell device at the level of the channel-accommodating body region TCS (23) which has a segment trench region STR1 adjacent each one of its four sides and an intersection trench region ITR1 adjacent each one of the four corners of the body region TCS (23). In operation in the on state an electron channel 23a is formed around the perimeter of the region 23. FIG. 10B shows the logarithmic drain-source electron current Ids versus gate-source voltage $V_{GS}$. Curve 10I shows an ideal curve due to the electron current excluding that at the cell corners for which the device would have a threshold voltage $V_{thI}$. Curve 10II shows the electron current Ids versus the gate-source voltage $V_{GS}$ at the corners of the cell only. Due to the higher electric field at the corners of the closed cells, the current at the cell corners is parasitically higher than the current at the cell sides for the lower values of gate-source voltage and has a parasitic effect lower threshold voltage $V_{thII}$. Curve 10III shows the total current by adding that in both curves 10I and 10II. The threshold gate-source voltage for the device is determined by the lower parasitic value $V_{thII}$ which is undesirable because this results in a low threshold voltage with a relatively high specific on-resistance, and this is more the case with trench-gate devices having the possibility of very low on-state resistance where transistor cell pitch and size are particularly small and properties of the cell corners have a greater effect. This parasitic threshold voltage becomes particularly important for a small cell pitch less than about 3 micron.

FIG. 10C of the accompanying drawings shows a cross-section view along the line I-I of FIG. 10A, that is showing part of the closed transistor cell TCS and part of the intersection trench region ITR1 adjacent a corner of the cell, but modified in accordance with the invention in a similar manner to FIG. 8C to have the insulating material 21C at the bottom of the intersection trench region ITR1 with a thickness greater than that of the insulating material 21B1 (see FIG. 8A) at the bottom of the segment trench region STR1, and additionally modified to exemplify and illustrate a preferred feature of the invention which counteracts the undesirable parasitic lowered threshold voltage discussed above. FIG. 10C shows that the part of the thicker trench bottom insulating material 21C which is nearest the corner of the adjacent transistor cell TCS extends upwards to thicken this gate insulating material at the corner of the cell TCS over part of the vertical extent of the channel-accommodating body region 23. Thus there is a lower portion 21A4 of the vertical sidewall trench insulation at the corner of the intersection trench region ITR1 which is thickened compared with an upper portion 21A3 of the vertical sidewall insulation, this upper insulation portion 21A3 having the same thickness as the vertical trench side insulation thickness 21A1 and bottom trench insulation thickness 21B1 in the segment trench regions STR1 (see FIG. 8A). FIG. 10C shows that at a gate-source voltage $V_{GS}$ equivalent to $V_{thII}$ shown in FIG. 10B an electron channel 23aII has formed adjacent the thin vertical corner insulation 21A3 while no electron channel has yet formed adjacent the thicker vertical corner insulation 21A4 and so the device is not turned on at the gate-source voltage $V_{thII}$. The device is turned on when an electron channel is also formed adjacent the thick vertical corner insulation 21A4 at a higher gate-source voltage than $V_{thII}$. Thus the device has an increased threshold voltage which is determined by the thick insulation 21A4 which can approach the threshold voltage $V_{thI}$ shown in FIG. 10B which would apply without the higher electric field trench cell corner effect.

Thus, in accordance with an optional preferred feature of the present invention, at least that part of the insulating material which extends from the bottom of each intersection trench region nearest the corners of the adjacent transistor cells extends upwards to thicken the insulating material at least at these corners over at least part of the vertical extent of the channel-accommodating region so as to increase the threshold voltage of the device.

In accordance with the optional preferred feature defined in the preceding paragraph, the insulating material in each intersection trench region which is thickened over at least part of the vertical extent of the channel-accommodating region may be so thickened only at a peripheral part of the area of the intersection trench region. Alternatively in accordance with this same optional preferred feature, the insulating material which extends from the bottom of each intersection trench region may have the same thickness over the whole area of the intersection trench region.

Preferably, in a device in accordance with the present invention the semiconductor body is silicon and the insulating material at the bottom of the segment trench regions and the insulating material extending from the bottom of the intersection trench regions is silicon dioxide.

A preferred method of making a device in accordance with the present invention includes a first sequence of steps at the conclusion of which there are provided trenches for the intersection trench regions with the insulating material which extends from the bottom of the trench regions, and in which there are provided empty trenches for the segment trench regions, and a second sequence of steps at the conclusion of which there is provided the insulating material at the vertical sides and bottom of the segment trench regions, and also there is provided the gate material in the segment trench regions and above the insulating material in the intersection trench regions.

The above-defined first sequence of steps preferably includes etching a first set of trenches in areas to be occupied by some of the segment trench regions and in areas to be occupied by the intersection trench regions, providing the insulating material which will extend from bottom of the intersection trench regions in the final device within and along the whole length of the first set of trenches, etching a second set of trenches in areas to be occupied by the remainder of the segment trench regions, providing a different insulating material to fill the second set of trenches and to cover the insulating material in the intersection trench regions, removing the insulating material from the segment trench regions of the first set of trenches, and then removing the different insulating material.

Before describing exemplary embodiments of the present invention, it is noted that International Patent Application published as WO-A-02/19432 (inventor Hshieh) identifies the intersection trench regions of a closed cell trench gate device as undesirably contributing to the gate-drain capacitance of the device, particularly where there is a high cell density for low on-resistance. Since there is no contribution to the device source-drain current in these intersection regions Hshieh proposes eliminating the trenches in these regions so as to remove this contribution to gate-drain capacitance, these intersection regions then being occupied by the semiconductor body. The drain-source reverse breakdown voltage BVds of the device is not mentioned by Hshieh, and we consider that the proposed structure results in trench bottom corners which will decrease the breakdown voltage BVds of the device contrary to the main object of the present invention. The matter of the device threshold voltage $V_{th}$ also is not mentioned by Hshieh.

BRIEF DESCRIPTION OF THE SEVERAL
VIEWS OF THE DRAWINGS

Exemplary embodiments of the present invention will now be described in detail with reference to the accompanying drawings, in which:

FIGS. 6A and 6B show plan views of part of a trench network of a square closed cell device as measured in FIG. 5, and FIG. 6C shows a section view along the line I-I of FIG. 6B; as has been described above;

FIGS. 7A and 7B show plan views of part of a trench network of a hexagonal closed cell device as measured in FIG. 5, and FIG. 7C shows a section view along the line I-I of FIG. 7C, as has been described above;

Figure 10A:
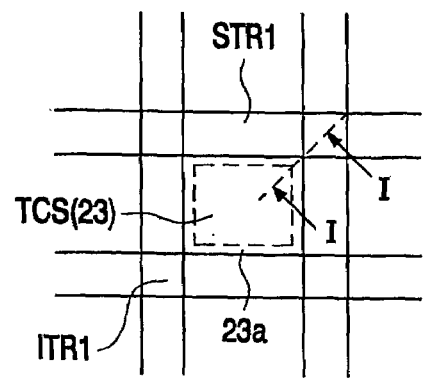
FIG. 10A shows a horizontal section view of part of a known closed square transistor cell device at the level of the channel-accommodating body region, as has been described above.
Figure 10B:
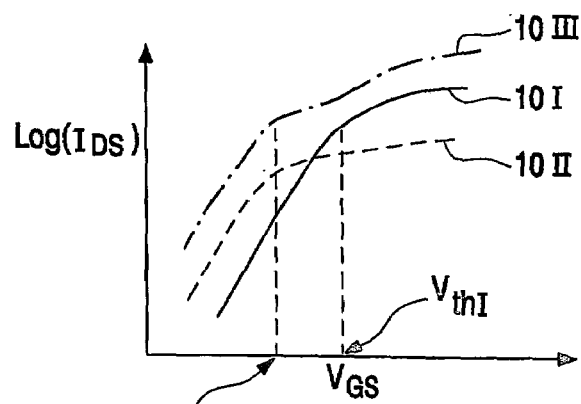
FIG. 10B shows drain-source current versus gate-source voltage at the corners and at the sides of the device shown in FIG. 10A, as has been described above.
Figure 11:
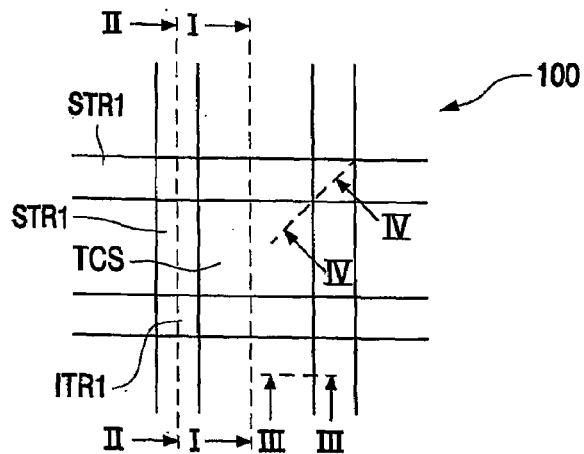
FIG. 11 shows a plan view of a closed square transistor cell device in accordance with one embodiment of the invention.
Figure 12:
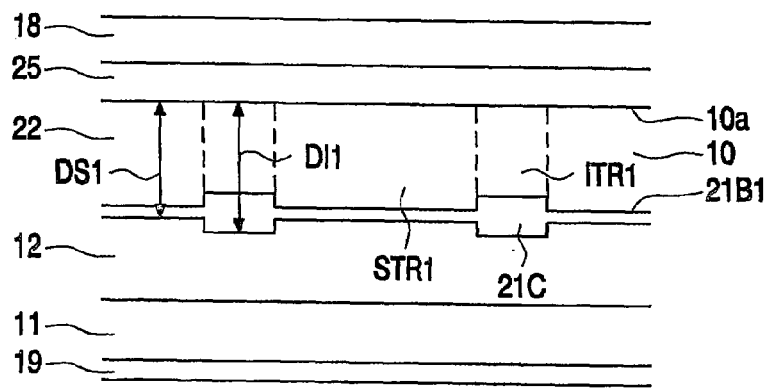
FIG. 12 shows a cross-section view along the line II-II shown in FIG. 11.
Figure 13:
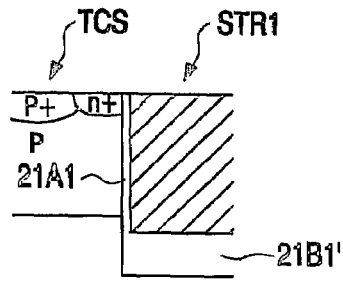
Figure 14:
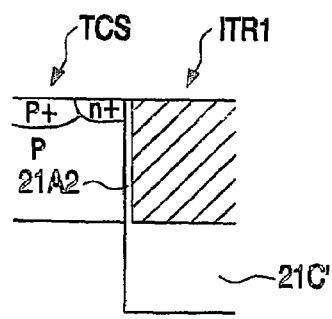
Figure 15:
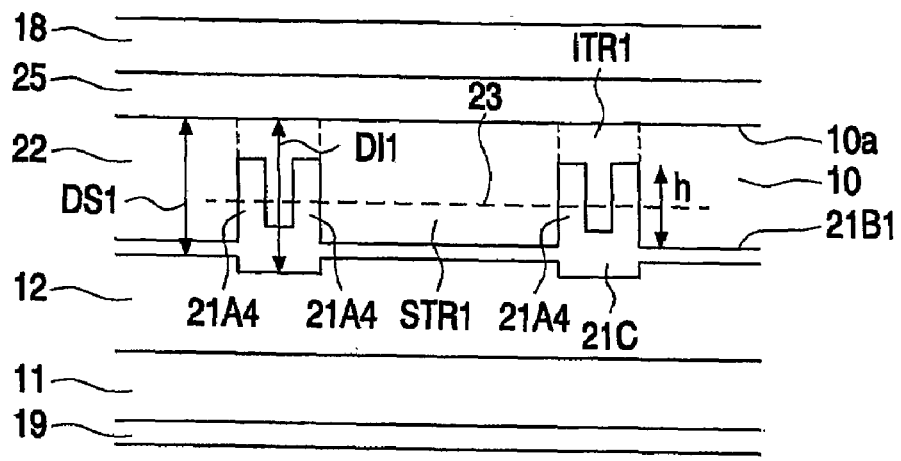
Figure 16:
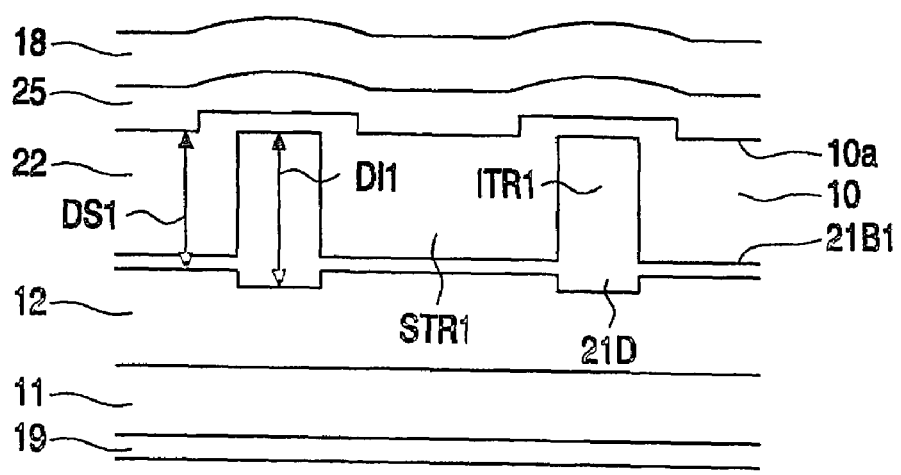
Figure 17:
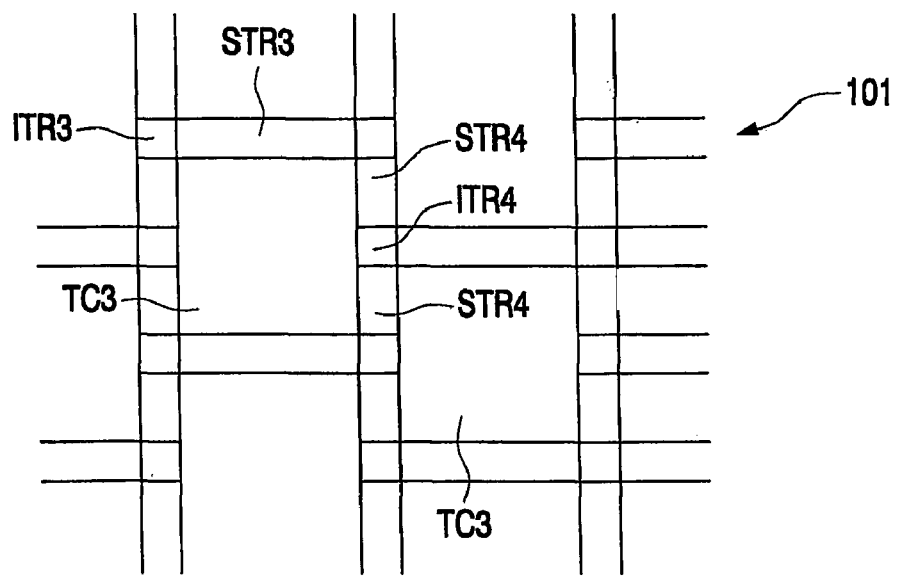
Figure 18:
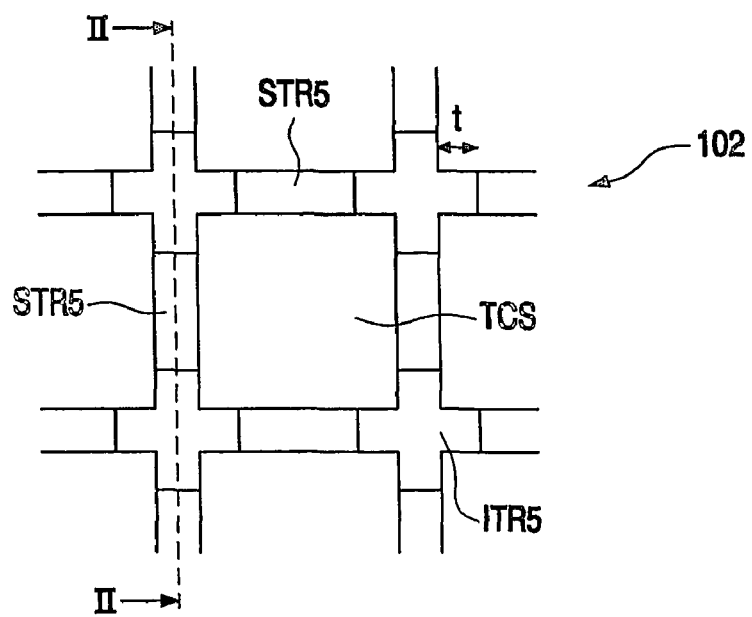
Figure 19:
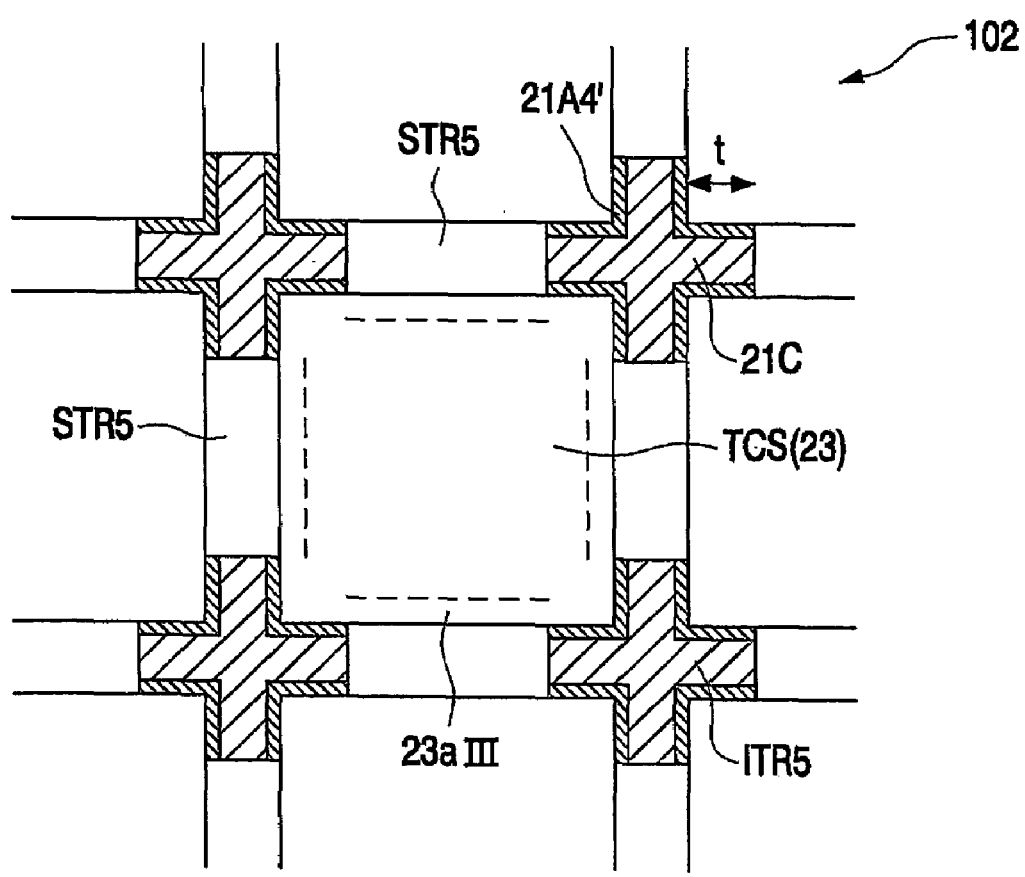
Figures 29A, 29B:
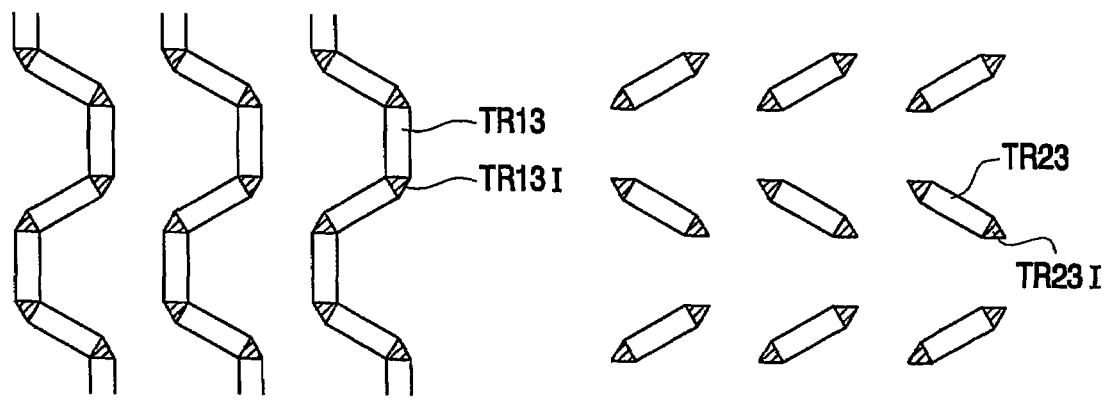
Figure 29C:
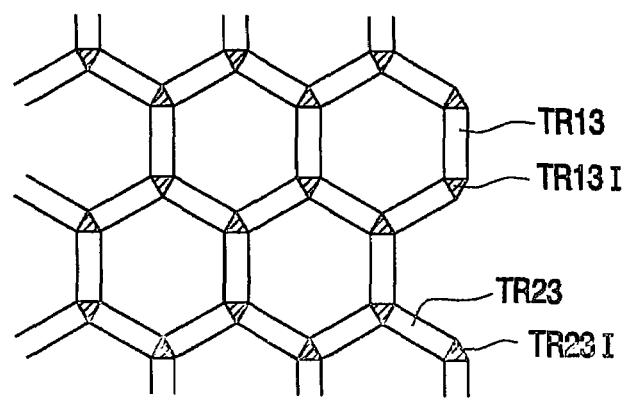
Figure 30A:
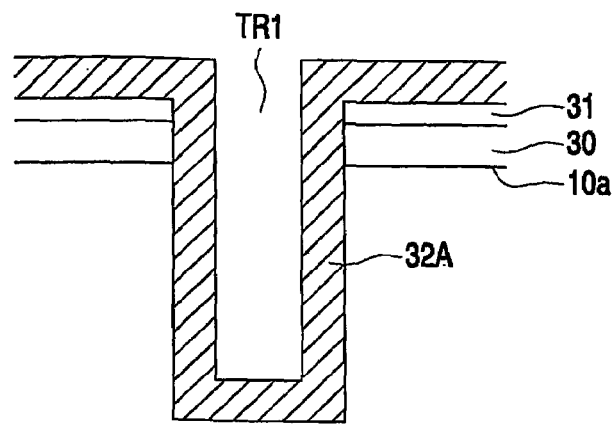
Figure 30B:
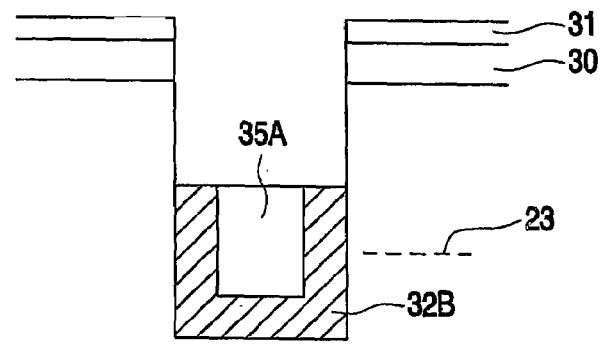
Figure 30C:
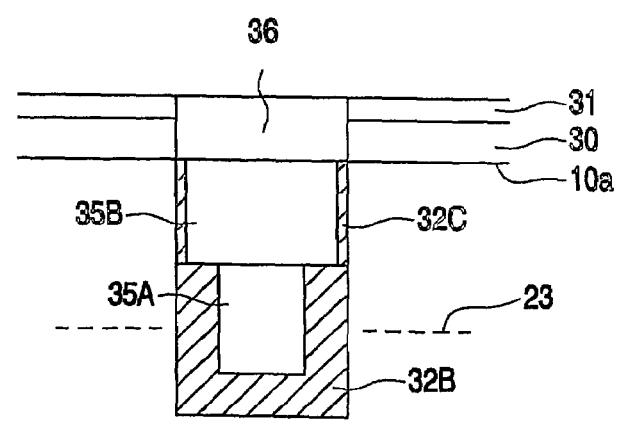

FIGS. 13 and 14 respectively show cross-section views along the lines III-III and IV-IV of FIG. 11 illustrating a modification of the device shown in FIGS. 11 and 12;

FIG. 15 shows a cross-section view along the line II-II of FIG. 11 but modified with respect to FIG. 12 in accordance with a different embodiment of the invention;

FIG. 16 shows a cross-section view along the line II-II of FIG. 11 but modified with respect to FIG. 12 in accordance with a further different embodiment of the invention;

FIG. 17 shows a plan view of a closed square transistor cell device with a modified cell layout in accordance with another embodiment of the invention;

FIG. 18 shows a plan view of a closed square transistor cell device with intersection trench regions having a modified shape in accordance with another embodiment of the invention;

FIG. 19 shows a horizontal cross-section view through the device of FIG. 18;

FIGS. 20 to 26 illustrate steps included in a method of making a device substantially in accordance with FIGS. 10 and 15;

FIGS. 27 to 29 illustrate modifications of part of the method shown in FIGS. 20 to 26 so as to make devices with different trench network layouts; and FIGS. 30A to 30C illustrate a modification of part of the methods shown in FIGS. 20 to 29 so as to make devices substantially in accordance with FIG. 15.

DETAILED DESCRIPTION OF THE INVENTION

Referring now to FIG. 11 of the accompanying drawings there is shown a plan view of part of a closed square rectangular transistor cell trench-gate semiconductor device 100 in accordance with one embodiment of the present invention. A segment trench region STR1 is adjacent each one of four sides of a transistor cell TCS and an intersection trench region ITR1 is adjacent each one of the four corners of the transistor cell TCS. The line I-I shown in FIG. 11 indicates a cross-section view of the device through two segment trench regions STR1 at opposite sides of a cell TCS and the mesa portion of the cell between those two segment regions. This cross-section view along the line I-I will be the same as the cross-section view shown in FIG. 1 for a conventional device and the description already given in relation to FIG. 1 can be taken as a description of the view along line I-I of FIG. 10.

Figure 1:
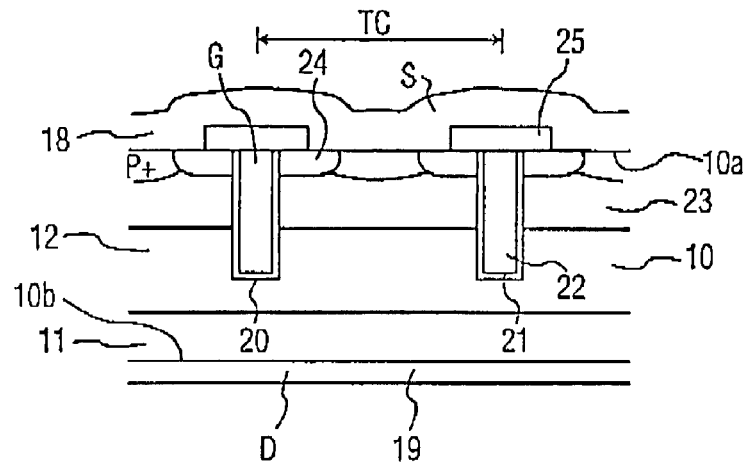
FIG. 1 shows a schematic cross-section view of a known trench-gate MOSFET as has been described above.
Figure 2:
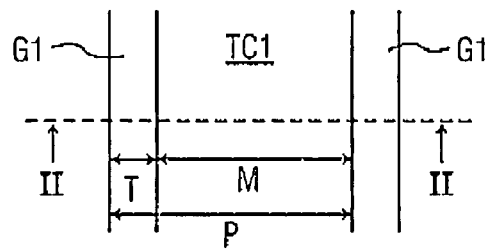
FIG. 2 shows a plan view of an open-cell geometry with the line II-II indicating the cross-section of FIG. 1.
Figure 3:
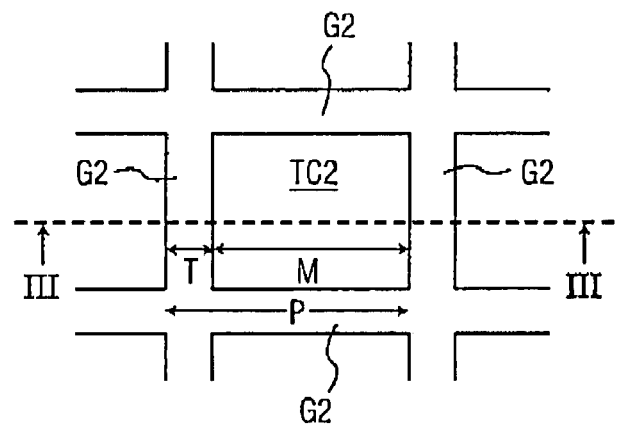
FIG. 3 shows a plan view of a closed square cell geometry with the line III-III indicating the cross-section of FIG. 1.
Figure 4:
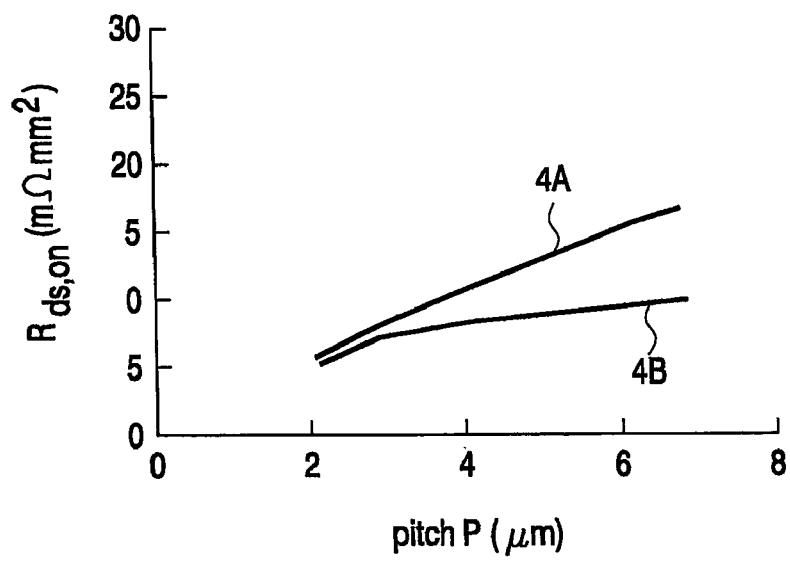
FIG. 4 shows our measurements of specific on-state resistance over a range of cell pitches for open and closed cell devices as shown in FIGS. 1 to 3, as has been described above.
Figure 5:
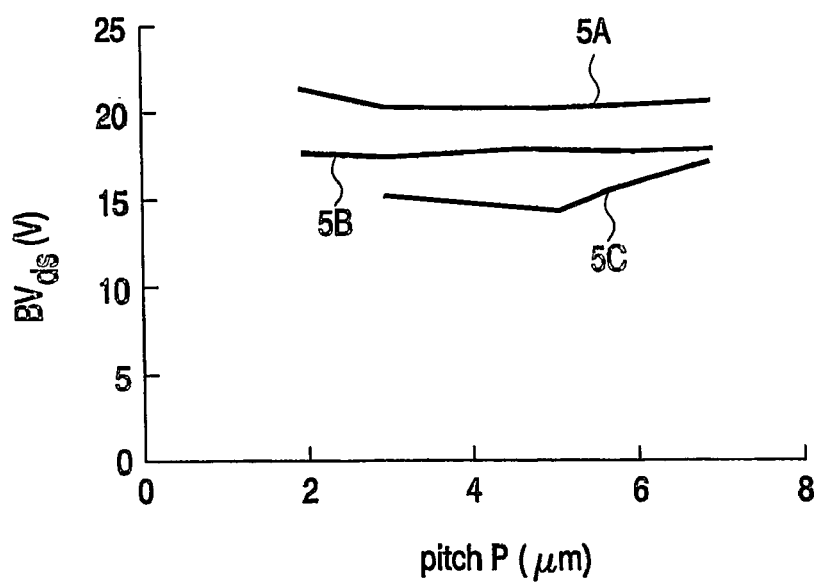
FIG. 5 shows our measurements of drain-source reverse breakdown voltage over a range of cell pitches for open and closed cell devices as shown in FIGS. 1 to 3, as has been described above.
Figure 8A:
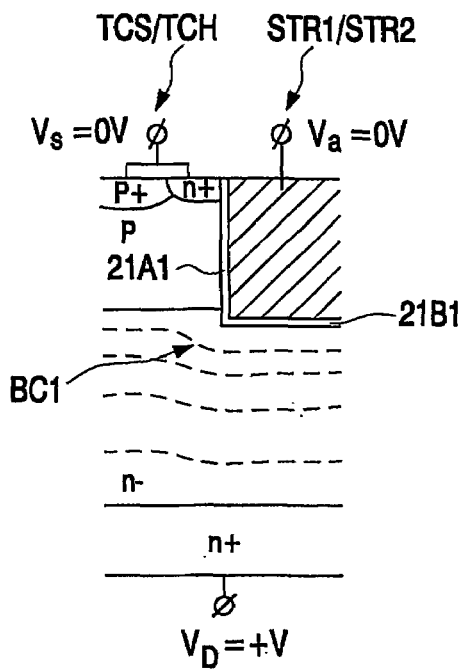
FIG. 8A shows a section view along the line I-I of both FIGS. 6A and 7A, which shows part of the segment trench region adjacent a side of the cell, as has been described above.
Figure 8B:
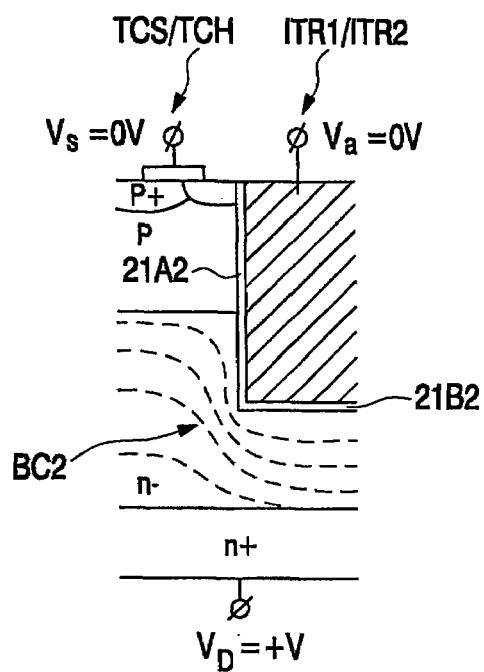
FIG. 8B shows a section view along the line II-II of both FIGS. 6A and 7A, which shows part of the intersection trench region adjacent a corner of the cell, as has been described above.
Figure 8C:
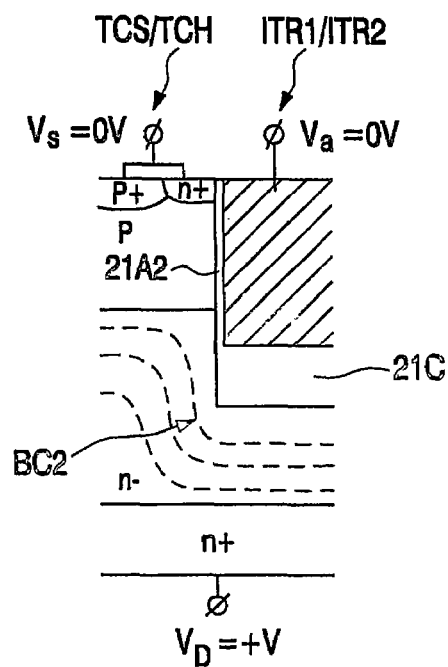
FIG. 8C shows the view of FIG. 8B modified in accordance with an embodiment of the present invention which increases the drain-source reverse breakdown voltage of the devices, as has been described above.
Figure 9A:
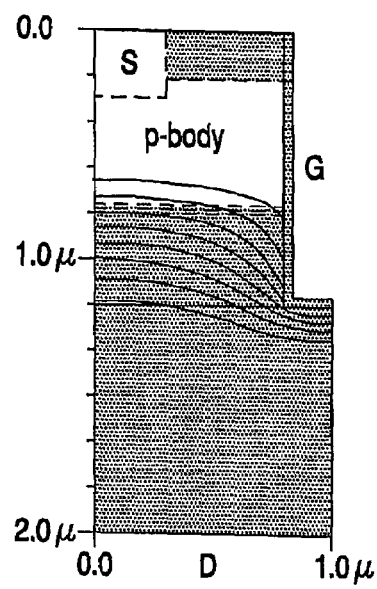
FIGS. 9A and 9B show simulation results on section views similar to those shown respectively in FIGS. 8B and 8C.
Figure 9B:
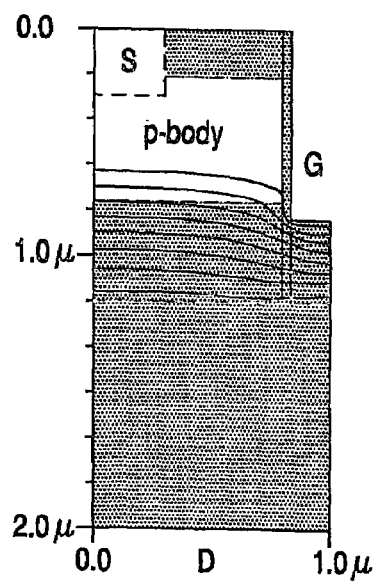

FIG. 12 of the accompanying drawings shows a cross-section view along the line II-II shown in FIG. 11, that is to say through and along a segment trench region STR1 and two intersection trench regions ITR1 at the ends of the segment trench region. FIG. 12 shows regions of the semiconductor body 10 of the device having a top surface 10a referenced in the same manner as in FIG. 1, that is to say gate material 22 in the trench regions STR1 and ITR1 above a drain drift region 12 and a drain region 11; and there is also shown an insulating region 25 over the gate material 22, a source metallisation layer 18 and a drain metallisation layer. As shown in FIG. 12 the depth DI1 of the trench in the intersection trench regions ITR1 is greater than the depth DS1 of the trench in the segment trench regions in the same manner as has been shown in FIG. 6C and for the reasons already explained in relation to FIG. 6C. A shown in FIG. 12 the insulating material 21C at the bottom of the intersection trench regions ITR1 has a thickness greater than that of the insulating material 21B1 at the bottom of the segment trench regions STR1 in the same manner as has already been shown in FIGS. 8A and 8C, and the thicker intersection trench bottom insulation 21C increases the drain-source reverse breakdown voltage BVds of the device as has already been explained with reference to FIG. 8C. The semiconductor body 10 of the device 100 is silicon and the insulating material 21 at the bottoms and sides of the trench regions is silicon dioxide. Although not shown in FIG. 12, the insulating material 21B1 at the bottom of the segment trench regions STR1 has the same thickness as the insulating material 21A1 (see FIG. 8A) at the vertical sides of the segment trench regions STR1. Although not shown in FIG. 1, the gate material 22 in the intersection trench regions bridges the gate material in the segment trench regions in that conventional device. FIG. 12 shows that the thickened insulating material 21C at the bottom of the intersection trench regions ITR1 nevertheless also allows the gate material 22 provided above the insulating material 21C in the intersection trench regions ITR1 to bridge the gate material 22 in the segment trench regions STR1. In the case of this device being a low voltage power transistor, that is with a drain-source breakdown voltage of up to about 50 volts, and having dimensions of the cell pitch, trench width, trench depth, channel-accommodating body region (23 as shown in FIG. 1) depth and drain drift region depth designed for low specific on-state resistance Rds,on similar to the dimensions given above in the discussion of FIG. 4, the intersection trench region bottom insulating material 21C thickness should be at least about 50 nm greater than the segment trench region bottom insulating material 21B1 thickness in order to provide a significant increase in the breakdown voltage BVds.

Referring now to FIG. 13 of the accompanying drawings, this shows a cross-section view along the line III-III of FIG. 11, that is showing part of the transistor cell TCS and part of the segment trench region STR1 adjacent a side of the cell (a view similar to that shown in FIG. 8A) but with a modification of the device 100 which is that the insulating material 21B1' at the bottom of the segment trench region STR1 is thicker than the insulating material 21A1 at the vertical sides of the segment trench region STR1 so as to reduce the gate-drain capacitance of the device. Referring now to FIG. 14 of the accompanying drawings, this shows a cross-section view along the line IV-IV of FIG. 11, that is showing part of the transistor cell TCS and part of the intersection trench region ITR1 adjacent a corner of the cell (a view similar to that shown in FIG. 8C) but in a modified device as shown in FIG. 13 and therefore having a greater thickness of insulating material 21C' at the bottom of the intersection trench region ITR1 than the thickness of the segment trench bottom insulating material 21B1' so as to further reduce the gate-drain capacitance of the device.

Referring now to FIG. 15 of the accompanying drawings there is shown a cross-section view which can be considered to be again along the line II-II shown in FIG. 11 but modified with respect to FIG. 12 in accordance with a different embodiment of the present invention. As shown in FIG. 15 part of the insulating material 21C which extends from the bottom of each intersection trench region ITR1 is extended upwards at two sides of the intersection trench region to form two vertical walls 21A4 of insulating material having a height h above the bottom insulating material 21B1 in the segment trench regions STR1. The height h is such that the walls 21A4 extend over at least that part of the vertical extent of the channel-accommodating body region 23, the bottom of the body region 23 being shown by a dashed lined in FIG. 15, which determines the gate-source threshold voltage $V_{th}$ of the device 100. Each vertical wall 21A4 of insulating material extends horizontally fully across one side of a square area intersection trench region so that the two walls 21A4 provided in each intersection trench area thicken the insulating material at a peripheral part of the area of that intersection trench region ITR1 which includes a part nearest all four corners of the adjacent transistor cells TCS. That is to say there is a thickening of the insulating material at these corners compared to the thickness which would be provided just by the vertical side walls of the insulating material in the segment trench regions STR1. The effect of these vertical walls 21A4 of insulating material is to increase the threshold voltage $V_{th}$ of the device in the manner which has been described and explained above in relation to the thick vertical corner insulation 21A4 shown in FIG. 10C.

The segment trench region bottom insulation layer 21B1 and the intersection trench region bottom insulation layer 21C as shown in FIG. 15 can be thickened to decrease the device gate-drain capacitance in the same manner as the insulation layers 21B1' and 21C' shown in FIGS. 13 and 14.

Referring now to FIG. 16 of the accompanying drawings there is again shown a cross-section view which can be considered to be along the line II-II shown in FIG. 11 but modified with respect to FIG. 12 in accordance with a further different embodiment of the invention. As shown in FIG. 16 insulating material 21D is provided in each of the intersection trench regions ITR1 which has the same thickness over the whole area of the intersection trench region and extends from the bottom to the top of the intersection trench region. In this embodiment the whole area thickened insulating material 21D need not extend to the top surface 10a of the semiconductor body 10 but will extend at least to the height h as shown in FIG. 15 for the reason explained above with respect to FIG. 15. The insulating material 21D provides the thickened bottom trench insulating material to increase the drain-source reverse breakdown voltage BVds of the device as is achieved by the embodiments shown in FIGS. 12 and 15, and also provides the thickened insulating material at the corners of the adjacent transistor cells TCS within the vertical extent of the channel accommodating body region 23 to increase the threshold $V_{th}$ of the device as is achieved by the embodiment shown in FIG. 15.

The embodiments of the present invention described above with reference to FIGS. 11 to 16 of the accompanying drawings relate to a closed square transistor cell trench-gate semiconductor device. The features of having thickened insulating material 21C, 21C', 21D at the bottom of the intersection trench regions to increase the breakdown voltage BVds of the device and having thickened upward extensions 21A4, 21D of the intersection trench region insulating material at the corners of the adjacent transistor cells to increase the threshold voltage $V_{th}$ of the device may also be used in other polygonal shaped closed transistor cell trench-gate devices. For example, considering the conventional hexagonal cell device shown above in FIGS. 7A and 7B then, by substituting the hexagonal segment trench regions STR2 for STR1 and by substituting the intersection trench region ITR2 for ITR1, the cross-section views shown in FIGS. 12 to 16 may represent cross-section views of a hexagonal cell device along the line I-I of FIG. 7B.

Referring now to FIG. 17 of the accompanying drawings there is shown a plan view of part of a closed square rectangular transistor cell trench-gate semiconductor device 101 in which the layout of the transistor cells is modified compared with the layout of the cells TCS shown in FIG. 11. The cells TC3 as shown in FIG. 17 have a "shifted squares" layout, that is to say they are arranged in two sets of alternate columns of square cells TC3, with one set of columns shifted by half a cell pitch with respect to the other set. Each square transistor cell TC3 has a segment trench region STR3 extending along each of two sides of the cell across the width of a column between two intersection trench regions ITR3 each at a corner of the cell TC3. Each square transistor cell TC3 also has a pair of segment trench regions STR4 extending along each of the two sides of the cell along the length of a column, each segment trench region STR4 being between an intersection trench region ITR3 at one corner of the cell and an intersection trench region ITR3 half way along one side of the cell. Referring back to FIGS. 6A to 6C, 7A to 7C, 8A and 8B and the description thereof in relation to the depth of intersection trench regions compared with segment trench regions and the effect on drain-source reverse breakdown voltage BVds, for intersection trench regions of the same area in the two layouts, each intersection trench region ITR3 has only three segment trench regions at its periphery compared with each intersection trench region ITR1 having four segment trench regions at its periphery so that with conventional single stage trench network etching, we would expect the intersection trench regions ITR3 to be less deep than the intersection trench regions ITR1 which would tend to decrease the breakdown voltage BVds to a lesser extent. The two extra intersection trench regions ITR3 between the segment trench regions STR4 for each transistor cell TC3 will reduce the channel perimeter and hence increase the on-state resistance $R_{ds}$on of the "shifted squares" device 101 of FIG. 17 compared with the conventional square cell device 100 of FIG. 6A by a small amount. The features of the invention described above with reference to FIGS. 11 to 16 of having thickened insulating material 21C, 21C', 21D at the bottom of the intersection trench regions to increase the breakdown voltage BVds of the device and having thickened upward extensions 21A4, 21D of the intersection trench region insulating material at the corners of the adjacent transistor cells to increase the threshold voltage $V_{th}$ of the device as described in relation to the conventional square cell layout device 100 of FIG. 11 may also be applied to the "shifted squares" cell layout device 101 of FIG. 17.

Figure 10C:
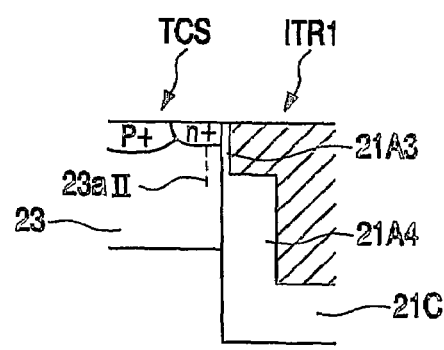
FIG. 10C shows a cross-section view along the line I-I of FIG. 10A, but modified in accordance with the present invention and further modified in accordance with a preferred optional feature of the present invention so as to increase the threshold voltage of the device, as has been described above.

Referring now to FIG. 18 of the accompanying drawings there is shown a plan view of part of a closed square rectangular transistor cell trench-gate semiconductor device 102 in which the intersection trench regions are modified compared with the intersection trench regions of the device 100 of FIG. 11. The intersection trench regions ITR5 of the device 102 have a cruciform shaped area with each leg of the cruciform shape extending a distance t along the side of a square transistor cell TCS. The segment trench regions STR5 of the device each have a length which, for the same mesa size of the cells, is an amount 2t less than the segment trench regions STR1 of the device 100 of FIG. 11. In one embodiment of the invention having cruciform shaped intersection trench regions ITR5 the insulating material at the bottom of the intersection trench regions ITR5 has a thickness greater than that of the insulating material at the bottom of the segment trench regions STR5 and a cross-section view of this embodiment along the line II-II of FIG. 18 will look similar to FIG. 12 with the modification that, all other dimensions being equal, the thickened bottom insulation layer 21C of the intersection trench region ITR5 will have a wider section and the bottom insulation layer 21B1 of the segment trench region STR5 will have a narrower section than the respective sections 21C and 21B1 shown in FIG. 12. In another embodiment of the invention having cruciform shaped intersection trench regions ITR5 part of the thickened insulating material which extends from the bottom of each intersection trench region ITR5 nearest a corner of the four adjacent transistor cells TCS is extended upwards over part of the vertical extent of the channel-accommodating body region in order to increase the threshold voltage $V_{th}$ of the device in the manner as has been explained with reference to FIG. 15. This embodiment is illustrated in FIG. 19 of the accompanying drawings which is a horizontal cross-section view through the device 102 at the vertical level of the channel-accommodating body region 23 where the thickened bottom insulating material 21C in the intersection trench regions ITR5 extends upwards as vertical walls 21A4' each at a corner of a square transistor cell TCS and extending a distance t along a side of the square transistor cell. The above description with reference to FIGS. 10A and 10B has explained how a higher electric field at the corners of closed transistor cells in a conventional trench-gate device has the effect of parasitically decreasing the threshold voltage $V_{th}$ of the device and the above description with reference to FIG. 10C illustrates the basic idea of counteracting this undesirable parasitic lowered threshold voltage by thickening part of the vertical gate insulating material, portion 21A4 as shown in FIG. 10C, in the intersection trench regions nearest the corners of the adjacent transistor cells. The embodiment shown in FIG. 19 substantially completely eliminates this parasitic threshold voltage lowering effect by ensuring that the electron channel 23aIII for a specific gate-source voltage is completely eliminated at the cell corners, that is to say the channel 23aIII is not present for a distance t from each corner of the cell. In another embodiment of the invention having cruciform shaped intersection trench regions ITR5 the thickened insulating material which extends upwards from the bottom of each intersection trench region ITR5 extends upwards with the same thickness over the whole area of the intersection trench region in the same manner as has been described with reference to FIG. 16 at least to the height h as has been explained with reference to FIGS. 15 and 16. It will be appreciated that complete elimination of the electron channel for a distance t from the corners of the transistor cell TCS by the insulating material in the cruciform intersection trench regions as has been described will reduce the channel perimeter of the device and so increase the specific on-state resistance Rdson. The length t of each leg of the insulation in the cruciform intersection trench regions needs to be optimised to balance this increase of on-state resistance against the beneficial effects on breakdown voltage BVds and threshold voltage $V_{th}$.

The closed square rectangular cells TCS, TC3 described with reference to and as shown in FIGS. 11, 17 and 18 could instead be closed oblong rectangular cells, and the description of FIGS. 11 to 19 would equally apply.

FIGS. 20 to 26 of the accompanying drawings illustrate steps included in a method of making a device substantially in accordance with FIGS. 11 and 16, that is a closed rectangular cell transistor device having square shaped area intersection trench regions and insulating material in each intersection trench region which has the same thickness over the whole area of the intersection trench region over the vertical extent of the channel-accommodating body region.

FIGS. 20A and 20B illustrate a silicon semiconductor body 10 at the end of a first step in the method, FIG. 20A being a plan view and FIG. 20B being a cross-section view along the line I-I in FIG. 20A. An n+ drain region substrate 11 is first provided and then an epitaxial n− drain drift region 12. Although not shown, acceptor implantation through the top surface 10a of the semiconductor body 10 is followed by donor implantation and then annealing to form regions respectively for the p type body regions 23 and the n+ type source regions 24 of the device as are shown in FIG. 1. A layer 30 of silicon dioxide, which may be formed using tetraethyl orthosilicate (TEOS), is then provided on the top surface 10a of the semiconductor body 10 and a layer 31 of silicon nitride is provided on the layer 30. First windows are formed in the oxide 30 and nitride 31 layers by photolithography and successive etching of these layers so as to provide a hard mask through which a first set of parallel trenches TR1 is etched in areas to be occupied by segment trench regions in a first direction and in areas to be occupied by intersection trench regions.

FIG. 21A illustrates a plan view and FIG. 21B illustrates a cross-section view along the line I-I in FIG. 21A at the end of a second step in the method in which the trenches TR1 are filled with silicon dioxide (TEOS) 32 which is then etched back to the top of the nitride layer 31. The silicon dioxide 32 is the insulating material which will extend from the bottom of only the intersection trench regions in the final device, but at the end of this second step it is provided within and along the whole length of the first set of parallel trenches TR1.

FIG. 22A illustrates a plan view, FIG. 22B illustrates a cross-section view along the line I-I in FIG. 22A and FIG. 22C illustrates a cross-section view along the line II-II in FIG. 22A at the end of a third step in the method. In this third step a second photolithographic mask is formed on the top surface of the regions 31, 32 through which these layers 31, 32 are etched to form a set of parallel second windows in a second direction perpendicular to the first direction. The semiconductor body 10 is then etched through this set of second windows to form a second set of parallel trenches TR2 in the areas to be occupied by segment trench regions in the second direction. In this etching of the semiconductor body the silicon dioxide 32 remains in the first set of trenches TR1 but has been etched back by a small depth TR1a in the intersection trench regions. The depth TR1a is determined during the etching of the silicon dioxide layer 30 when creating the second set of windows to be used for etching the trenches TR2. When etching this second set of windows, the silicon dioxide (TEOS) layer 32 at the intersections will automatically be etched to the depth TR1a at the same time.

FIG. 23A illustrates a plan view, FIG. 23B illustrates a cross-section view along the line I-I in FIG. 23A and FIG. 23C illustrates a cross-section view along the line II-II in FIG. 23A at the end of a fourth step in the method. In this fourth step the second set of parallel trenches TR2 is filled, and the etched back regions TR1a which are above the silicon dioxide 32 are also filled, with silicon nitride 33 which is etched back so as not to cover the silicon dioxide 32 in the segment trench regions of the first set of parallel trenches TR1. The segment trench regions of the first set of parallel trenches TR1 are thus filled with a first insulating material, silicon dioxide, and the segment trench regions corresponding to the second set of parallel trenches TR2 are filled with different insulating material, silicon nitride; the different insulating material also covering the first insulating material in the intersection trench regions.

FIG. 24A illustrates a plan view, FIG. 24B illustrates a cross-section view along the line I-I in FIG. 24A and FIG. 24C illustrates a cross-section view along the line II-II in FIG. 24A at the end of a fifth step in the method. In this fifth step the silicon dioxide 32 is removed by etching from the segment trench regions of the trenches TR1 in the first direction. The silicon dioxide 32 which is in the intersection trench regions is not removed by this etching since it is covered by silicon nitride 33.

FIG. 25A illustrates a plan view, FIG. 25B illustrates a cross-section view along the line I-I in FIG. 25A and FIG. 25C illustrates a cross-section view along the line II-II in FIG. 25A at the end of a sixth step in the method. In this sixth step the silicon nitride 33 is removed by etching from the segment trench regions TR2 between the trenches TR1 in the second direction and from over the silicon dioxide 32 in the intersection trench regions.

The above-described six steps thus provide a first sequence of steps at the conclusion of which there are provided trenches for the intersection trench regions with the insulating material 32 which extends from the bottom of the intersection trench regions, and in which there are provided empty trenches TR1, TR2 in the first direction and the second, perpendicular direction for the segment trench regions. An alternative first sequence of steps which would arrive at this same conclusion would be to etch the whole trench network consisting of the segment trench regions and the intersection trench regions, then to fill the whole trench network with silicon dioxide (TEOS) and then etch the segment trench regions empty with a mask which covers the intersection trench regions. This will result in the intersection trench regions being deeper than the segment trench regions. This alternative first sequence of steps would allow the intersection trench regions to contain an insulating material different from instead of the same as the gate insulating material to be provided in the segment trench regions.

FIG. 26A illustrates a plan view, FIG. 26B illustrates a cross-section view along the line I-I in FIG. 26A and FIG. 26C illustrates a cross-section view along the line II-II in FIG. 26A at the conclusion of a second sequence of steps which follows the first sequence of steps described above. In this second sequence of steps insulating material, silicon dioxide, 34 is provided at the bottom walls 21B1 and vertical side walls 21A1 of the segment trench regions TR1, TR2. Then gate material 22, doped polycrystalline silicon, is provided in the segment trench portions TR1, TR2 to provide segment trench-gate regions STR1 and above the silicon dioxide insulating material 32 in the intersection trench regions so as to bridge the gate material 22 in the segment trench regions TR1, TR2. FIG. 26C substantially corresponds to FIG. 16 described above with the insulating material 32 shown in FIG. 26C corresponding to the insulating material 21D shown in FIG. 16.

After the second sequence of steps just described with reference to FIGS. 26A to 26C, further processing is performed to insulate the top surface of the gate material 22 and etch the silicon dioxide layer 30 so that source metal may contact the source and body regions at the top surface 10a. One method could be to deposit an additional silicon dioxide layer (TEOS) on top of the structure shown in FIGS. 26A to 26C and then use a mask to etch through this additional silicon dioxide layer and the silicon dioxide layer 30.

It will be noted that FIG. 16 shows the intersection trench regions ITR1 having a greater depth than the segment trench regions STR1, which is consistent with the conventional process of etching the whole trench network in a single stage as discussed and explained with respect to FIGS. 6B and 6C. By contrast, FIG. 26C shows the intersection trench regions ITR1 having the same depth as the segment trench regions STR1. This equality of depth is made possible by etching the trench network in two separate stages as in the first and third steps described above. It is also possible that the trenches TR1 etched in the first step will be deeper than the trenches TR2 etched in the third step, in which case the intersection trench regions ITR1 will be deeper than the segment trench regions STR2 etched in the third step. If the method is modified so that in the second step described above with reference to FIGS. 21A, B and C the trenches TR1 are only partly filled then this will result in the intersection trench regions ITR1 being partly filled in accordance with the insulation layer 21C in the embodiment of the invention shown in FIG. 12.

FIG. 27 to 29 illustrate modifications of the method described with reference to FIGS. 20 to 26 having regard to the pattern used for etching the first set of trenches TR1 in the first step in areas to be occupied by some of the segment trench regions of the device and in areas to be occupied by the intersection trench regions, and having regard to the pattern used for etching the second set of trenches TR2 in the third step in areas to be occupied by the remainder of the segment trench regions of the device.

FIGS. 27A to 27C show patterns used for producing a "shifted squares" trench network as shown in FIG. 17. FIG. 27A shows the trench pattern TR11 for some of the segment trench regions and the square shaped intersection trench regions, shown shaded as TR11I, used in the first step. FIG. 27B shows the trench pattern TR21 for the remainder of the segment trench regions and which also extends over the intersection trench regions, shown shaded as TR21I, used in the third step. The overlap positioning of these two patterns is shown in FIG. 27C.

FIGS. 28A to 28C show patterns used for producing a cruciform shaped intersection trench network as shown in FIG. 18. FIG. 28A shows the trench pattern TR12 for some of the segment trench regions and the cruciform shaped intersection trench regions, shown shaded as TR12I, used in the first step. FIG. 28B shows the trench pattern TR22 for the remainder of the segment trench regions and which also extends over the intersection trench regions, shown shaded as TR22I, used in the third step. The overlap positioning of these two patterns is shown in FIG. 28C.

FIG. 29A to 29C show patterns used for producing a hexagonal closed cell trench network. FIG. 29A shows the trench pattern TR13 for some of the segment trench regions and the triangular shaped intersection trench regions, shown shaded as TR13I, used in the first step. FIG. 29B shows the trench pattern TR23 for the remainder of the segment trench regions and which also extends over the intersection trench regions, shown shaded as TR23I, used in the third step. The overlap positioning of these two patterns is shown in FIG. 29C.

FIGS. 30A to 30C are cross-section views through the first trenches TR1 which have been formed according to the first step described above with reference to FIGS. 20A and 20B, but in which the second step described above with reference to FIGS. 21A and 21B is modified by a staged process so that instead of this second step ending with the trenches TR1 completely filled with silicon dioxide (TEOS) it ends with the trenches filled with a composite structure which will enable a device to be formed substantially in accordance with FIG. 15 shown and described above. FIG. 30A illustrates a first stage of this modified second step in which a layer of silicon dioxide (TEOS) 32A is formed at the bottom and vertical side walls of the trenches TR1 and also extends up and over the silicon dioxide layer 30 and silicon nitride layer 31 on the top surface 10a of the semiconductor body 10. The thickness of this layer 32A is made to correspond to the thickness required for the trench bottom insulation 21C and vertical side wall insulation 21A4 as described and shown above with reference to FIG. 15. FIG. 30B illustrates a second stage of this modified second step in which polycrystalline silicon 35A is deposited and then etched back to the level shown which is a determined height above the bottom of the channel-accommodating channel region 23 as shown by the dashed line in FIG. 30B, and in which the silicon dioxide (TEOS) layer 32A is then etched back to form the cup shaped region 32B level with the top of the polycrystalline silicon 35A as shown in FIG. 30B. FIG. 30C illustrates a third stage of this modified second step in which a thin layer of silicon dioxide 32C is provided at the vertical side walls of the trench TR1 in order to prevent gate-source leakage; then polycrystalline silicon 35B is deposited in the trench TR1 and etched back to the top 10a of the body 10; and then a silicon dioxide layer 36 is provided on top of the polycrystalline silicon 35B within the window in the mask provided by the layers 30, 31. The method then proceeds in the same manner as steps three and four described above with respect to FIGS. 22 and 23. The fifth step described above with respect to FIG. 24 is modified to empty the segment trench regions of the trenches TR1 outside the intersection trench regions by successively removing from those TR1 segment trench regions the regions 36, 35B and 35A, 32C and 32B shown in FIG. 26C. The method then proceeds in the same manner as described above with respect to FIGS. 25 and 26.

From reading the present disclosure, other variations and modifications will be apparent to persons skilled in the art. Such variations and modifications may involve equivalent and other features which are already known in the art, and which may be used instead of or in addition to features already described herein.

Although Claims have been formulated in this Application to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any Claim and whether or not it mitigates any or all of the same technical problems as does the present invention.

Features which are described in the context of separate embodiments may also be provided in combination in a single embodiment. Conversely, various features which are, for brevity, described in the context of a single embodiment, may also be provided separately or in any suitable subcombination. The Applicants hereby give notice that new Claims may be formulated to such features and/or combinations of such features during the prosecution of the present Application or of any further Application derived therefrom.

The invention claimed is:

1. A vertical power transistor trench-gate semiconductor device having a trench network extending into a semiconductor body and surrounding a plurality of closed transistor cells, wherein the trench network comprises segment trench regions adjacent sides of the transistor cells and intersection trench regions adjacent corners of the transistor cells, wherein each transistor cell has a source region and a drain region which are vertically separated by a channel-accommodating body region adjacent a segment trench region at each side of the transistor cell, and wherein each segment trench region contains gate material separated from the semiconductor body by insulating material at the vertical sides and at the bottom of the segment trench region, wherein the intersection trench regions each include insulating material which extends from the bottom of the intersection trench region with a thickness which is greater than the thickness of the insulating material at the bottom of the segment trench regions, gate material being provided above the insulating material in the intersection trench regions and bridging the gate material in the segment trench regions, wherein the greater thickness of the insulating material extending from the bottom of the intersection trench regions is effective to increase the drain-source reverse breakdown voltage of the device.

2. A device as claimed in claim 1, wherein the insulating material is thicker at the bottom of the trench segment regions than at the vertical sides of the trench segment regions so as to reduce the gate-drain capacitance of the device and wherein the greater thickness of insulating material extending from the bottom of the intersection trench regions further reduces the gate-drain capacitance of the device.

3. A device as claimed in claim 1, wherein the closed transistor cells are each rectangular shaped with a said segment trench region adjacent each one of four sides of the cell.

4. A device as claimed in claim 3, wherein the closed transistor cells are square shaped.

5. A device as claimed in claim 3, wherein each intersection trench region has a square shaped area.

6. A device as claimed in claim 3, wherein each intersection region has a cruciform shaped area.

7. A device as claimed in claim 1, wherein the closed transistor cells are each hexagonal shaped with a said segment trench region adjacent each one of six sides of the cell.

8. A device as claimed in claim 1, wherein at least that part of the insulating material which extends from the bottom of each intersection trench region nearest the corners of the adjacent transistor cells extends upwards to thicken the insulating material at least at these corners over at least part of the vertical extent of the channel-accommodating body region so as to increase the threshold voltage of the device.

9. A device as claimed in claim 8, wherein the insulating material in each intersection trench region which is thickened over at least part of the vertical extent of the channel-accommodating region is so thickened only at a peripheral part of the area of intersection trench region.

10. A device as claimed in claim 8, wherein the insulating material which extends from the bottom of each intersection trench region has the same thickness over the whole area of the intersection trench region.

11. A device as claimed in claim 1, wherein the semiconductor body is silicon and wherein the insulating material at the bottom of the segment trench regions and the insulating material extending from the bottom of the intersection trench regions is silicon dioxide.

12. A method of making a device as claimed in claim 1, the method including
a first sequence of steps at the conclusion of which there are provided trenches for the intersection trench regions with the insulating material which extends from the bottom of the intersection trench regions, and in which there are provided empty trenches for the segment trench regions, and
a second sequence of steps at the conclusion of which there is provided the insulating material at the vertical sides and bottom of the segment trench regions, and also there is provided the gate material in the segment trench regions and above the insulating material in the intersection trench regions.

13. A method as claimed in claim 12, wherein the first sequence of steps includes
    etching a first set of parallel trenches in areas to be occupied by some of the segment trench regions and in areas to be occupied by the intersection trench regions
    providing the insulating material which will extend from bottom of the intersection trench regions in the final device within and along the whole length of the first set of trenches
    etching a second set of trenches in areas to be occupied by the remainder of the segment trench regions
    providing a different insulating material to fill the second set of trenches and to cover the insulating material in the intersection trench regions removing the insulating material from the segment trench regions of the first set of trenches and then removing the different insulating material.

* * * * *